(12) United States Patent
Azdasht

(10) Patent No.: US 8,988,094 B2
(45) Date of Patent: Mar. 24, 2015

(54) TEST CONTACT ARRANGEMENT

(75) Inventor: Ghassem Azdasht, Berlin (DE)

(73) Assignee: Pac Tech-Packaging Technologies GmbH, Nauen (DE)

( * ) Notice: Subject to any disclaimer, the term of this patent is extended or adjusted under 35 U.S.C. 154(b) by 477 days.

(21) Appl. No.: 12/933,764

(22) PCT Filed: Mar. 27, 2009

(86) PCT No.: PCT/DE2009/000393
§ 371 (c)(1), (2), (4) Date: Dec. 17, 2010

(87) PCT Pub. No.: WO2009/117992
PCT Pub. Date: Oct. 1, 2009

(65) Prior Publication Data
US 2011/0089963 A1    Apr. 21, 2011

(30) Foreign Application Priority Data

Mar. 27, 2008  (DE) .......................... 10 2008 016 247

(51) Int. Cl.
G01R 31/20 (2006.01)
G01R 1/073 (2006.01)
G01R 1/067 (2006.01)

(52) U.S. Cl.
CPC ........ G01R 1/07342 (2013.01); *G01R 1/06733* (2013.01)
USPC ............ 324/755.07; 324/755.01; 324/755.04; 324/754.01

(58) Field of Classification Search
CPC ........... G01R 1/07342; G01R 1/06733; G01R 1/06711; G01R 1/6727

USPC ............ 324/754.03, 754.01, 755.07, 755.04, 324/755.01
See application file for complete search history.

(56) References Cited

U.S. PATENT DOCUMENTS 3,702,439 A *  11/1972  McGahey et al. ........ 324/754.03
6,014,032 A *   1/2000  Maddix et al. .......... 324/750.26
6,452,407 B2    9/2002  Khoury et al.
6,776,624 B2 *  8/2004  Suematsu ................... 439/71

(Continued)

FOREIGN PATENT DOCUMENTS

DE     199 26 701 A1   12/1999
JP     2001050981 A     2/2001

(Continued)

OTHER PUBLICATIONS

English translation of Koren patent KR 100799166B1, Lee.*

(Continued)

*Primary Examiner* — Arleen M Vazquez
*Assistant Examiner* — Robert P Alejnikov, Jr.
(74) *Attorney, Agent, or Firm* — Quarles & Brady LLP

(57) ABSTRACT

The invention relates to a test contact arrangement (15) for testing semiconductor components, comprising at least one test contact (10) which is arranged in a test contact frame (13) and is designed in the type of a cantilever arm and which has a fastening base (12) and a contact arm (30) which is provided with a contact tip (11) and which is connected to the fastening base, wherein the fastening base is inserted with a fastening projection (16) thereof into a frame opening (14) of the test contact frame in such a manner that a lower edge (17) of the fastening projection is essentially aligned flush with a lower side (18) of the test contact frame.

7 Claims, 2 Drawing Sheets

(56) References Cited

U.S. PATENT DOCUMENTS

| | | | |
|---|---|---|---|
| 6,847,221 B2 * | 1/2005 | Kimoto et al. | 324/755.06 |
| 7,047,638 B2 * | 5/2006 | Eldridge et al. | 29/884 |
| 2002/0055282 A1 | 5/2002 | Eldridge et al. | |
| 2007/0257685 A1 * | 11/2007 | Mochizuki | 324/754 |
| 2007/0296433 A1 | 12/2007 | Gritters | |
| 2008/0007282 A1 * | 1/2008 | Hasegawa et al. | 324/757 |

FOREIGN PATENT DOCUMENTS

| | | | | |
|---|---|---|---|---|
| JP | 2003 035723 A | 2/2003 | | |
| JP | 2003185676 A | 7/2003 | | |
| JP | 2003329734 A | 11/2003 | | |
| JP | 2005534013 A | 11/2005 | | |
| KR | 100799166 B1 * | 1/2008 | | H01L 21/66 |
| WO | 2004010152 A1 | 1/2004 | | |

OTHER PUBLICATIONS

International Search Report and International Preliminary Report on Patentability Corresponding to PCT/DE2009/000393.

Japan Patent Office, Notice of Reasons for Refusal (English Translation included), Patent Application No. 2011-501101, Apr. 24, 2013.

* cited by examiner

TEST CONTACT ARRANGEMENT

CROSS-REFERENCE TO RELATED APPLICATIONS

This application claims priority to PCT International Application No. PCT/DE2009/000393 filed on Mar. 27, 2009, which claims priority to German Patent Application No. 10 2008 016 247.7 filed Mar. 27, 2008, both of which are incorporated herein by reference.

The present invention relates to a test contact arrangement for testing semiconductor components, comprising at least one test contact which is arranged in a test contact frame and is designed in the type of a cantilever arm and which has a fastening base and a contact arm which is provided with a contact tip and which is connected to the fastening base, wherein the fastening base is inserted with a fastening projection thereof into a frame opening of the test contact frame in such a manner that a lower edge of the fastening projection is essentially aligned flush with a lower side of the test contact frame.

Test contact arrangements which are regularly provided with a plurality of test contacts arranged on a test contact frame are employed in the electronic component testing of semiconductor components, in particular of chips, and enable a merely temporary connection of the terminal faces of the chip with a testing device, which makes it possible to apply a voltage to the component corresponding to a preset test routine.

For this purpose, the known test contact arrangements feature a test contact frame which is essentially designed as a circuit board in the type of a printed circuit board (PCB), the contact frame on the upper side thereof being provided with the test contacts, which serve for temporary contacting with the chip, and on the lower side thereof having terminal contacts for electrical connection with the testing device. The connection between the test contacts arranged on the upper side and the terminal contacts arranged on the lower side is regularly carried out with the aid of vias formed in the circuit board, which may for instance be formed by a conductor path structure.

In particular due to the formation of the vias which are integrated in the circuit board material, the production of the known test contact arrangements is associated with a plurality of method steps and thus proves to be correspondingly complex.

Thus, it is an object of the present invention to propose a test contact arrangement, which can be produced subject to comparatively low production complexity.

This object is achieved by a test contact arrangement encompassing the features of claim 1.

The inventive test contact arrangement comprises at least one test contact which is arranged in a test contact frame and is designed in the type of a cantilever arm and which has a fastening base and a contact arm which is provided with a contact tip and which is connected to the fastening base, wherein the fastening base is inserted with a fastening projection thereof into a frame opening in such a manner that a lower edge of the fastening projection is essentially aligned flush with a lower side of the test contact frame.

Due to the design of the test contact so as to penetrate the cross-section of the test contact frame in the region of the frame opening, the test contact with its contact arm not only enables the contacting with the component to be tested, but with the fastening projection thereof, which with its lower edge is essentially aligned flush with the lower side of the test contact frame, additionally also enables the formation of a terminal contact for direct contacting with the testing device, without the need to form vias in the test contact frame independently of the test contact.

Instead, due to the inventive design of the test contact arrangement, the function of a via is fulfilled, by the test contact, so that the test contact has a double function, namely on the one hand to carry out the contacting with the component to be tested, and on the other hand, to establish an electrically conductive connection between the contact arm arranged on the upper side of the test contact frame and the lower side of the test contact frame in the type of a via with the aid of the fastening base, respectively the fastening projection. To fulfill this double function, firstly, it is basically irrelevant if the lower edge of the fastening projection is aligned perfectly flush with the surface of the lower side of the test contact frame, or else if it is slightly retracted with respect thereto or protrudes therefrom, as long as a direct electrically conductive connection can be established between the lower edge of the fastening projection and contacts of a testing device without for this purpose requiring the formation of further conductor paths.

In a preferred embodiment of the test contact arrangement, the fastening base is provided with at least one positioning stop at a distance a from the lower edge, wherein the distance a corresponds to the thickness of the test contact frame. Having the above specified design, in the production of the test contact arrangement, the above described essentially flush alignment of the lower edge of the fastening projection of the test contact with respect to the lower side of the test contact frame is mandatorily realized when the positioning stop abuts against the upper side of the test contact frame the upon insertion of the test contact into the frame opening.

It is also advantageous if the fitting engagement between the fastening projection of the test contact, which is inserted into the frame opening, and the frame opening is configured as a press-fit engagement, so that when the test contact is inserted into the frame opening, a clamping contact is established between the test contact and the test contact frame and depending on the magnitude of the thus produced clamping forces, at least a temporary fixation of the test contact in the test contact frame can be realized, which facilitates the production of a subsequently established permanent connection between the test contact and the test contact frame.

If the test contact frame and the test contact are connected to one another via a solder material connection established on the lower side of the test contact frame, the production of a permanent mechanical connection involving minimal complexity is rendered possible, and at the same time, raised contact metallizations can be formed, which form terminal contacts in the type of "solder bumps" which can be directly contacted with the testing device.

If, beyond that, the solder material connection is established between at least one contact point, which is arranged on the lower side and which is formed in an electrically conductive manner, and the lower edge of the fastening projection of the test contact, the production of a mechanically particularly resistant and correspondingly reliable solder connection during operation can be realized between the test contact and the test contact frame. Such contact points can be created for instance by contact material coatings known as such, which, in technical terminology, are also known as so-called "under bump metallizations (UBM)" and for instance feature a gold or a nickel/gold coating on an adhesive agent applied to the inherently non-conductive material of the test contact frame.

If the contact point is positioned at an opening edge of the frame opening, due to the arrangement of the contact point so as to be directly adjacent to the lower edge of the fastening projection, it is possible to utilize a solder material deposit with a mass that is as low as possible in order to produce the solder material connection. Thus, it is also possible to produce a solder material connection by means of a solder material deposit cast onto the contact point for instance in an ejection process with a subsequent re-melting process.

If, according to a preferred embodiment, the frame opening arranged in the test contact frame has two parallel opening edges which extend in a plane direction of the test contact frame, a plurality of test contacts with their fastening projections being arranged in a row arrangement between the opening edges in such a manner that the contact arms are aligned transverse to the plane direction, using a test contact row arrangement formed in this manner, it is possible to carry out a simultaneous contacting of terminal contacts, which are arranged in a corresponding row arrangement, of the component to be tested in a single contact process.

If, beyond that, the test contact frame has a plurality of frame openings which are disposed in a matrix arrangement and are each provided with a test contact row arrangement, the test contact arrangement can be utilized for simultaneous contacting with a plurality of components to be tested, each having terminal faces disposed in a row arrangement.

It is particularly advantageous if the matrix arrangement has a plurality of groups which are each assigned to a component and comprise at least two frame openings disposed in parallel to one another and each being provided with a test contact row arrangement, in such a manner that contact tips formed at the ends of the contact arms are arranged in a contact tip arrangement corresponding to a terminal face arrangement of the component to be tested. Designed in this manner, the test contact arrangement enables the testing of semiconductor components on a wafer level, i.e. for instance the testing of a wafer comprising a plurality of semiconductor components arranged in an assembly even prior to their separation from the wafer assembly.

Hereinafter, preferred embodiments will be described in more detail with reference to the drawings.

Figure 1:
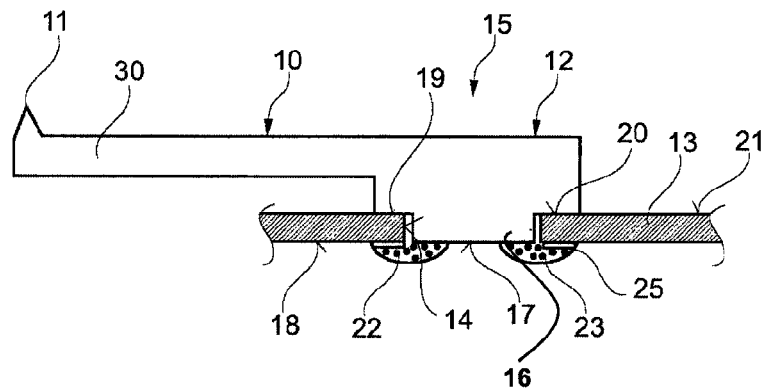
FIG. 1 shows a test contact inserted into a frame opening of a test contact frame with solder material connections formed on the lower side of the test contact frame.

FIG. 1 shows a test cantilever which is hereinafter referred to as test contact 10 and which at a cantilever arm 30 has a contact tip 11 and is connected to a test contact frame 13 via a fastening base 12 formed at the opposite end of the cantilever arm 30, the test contact frame having a frame opening 14 which extends perpendicular to the drawing plane.

Figure 3:
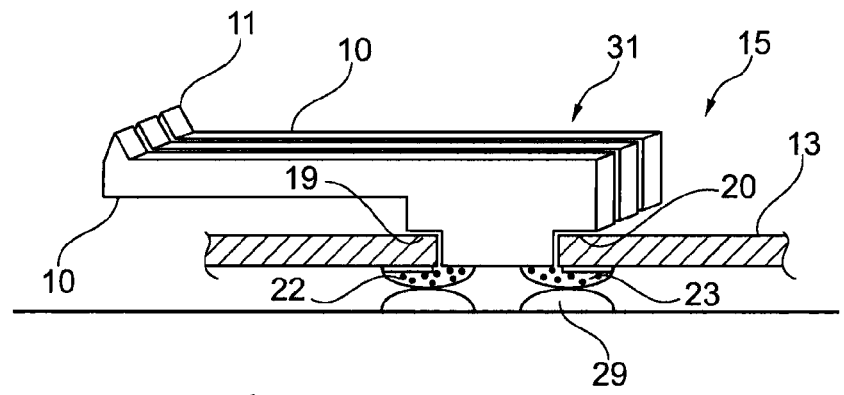
FIG. 3 shows a test contact arrangement contacted with a testing device comprising a test contact row arrangement.

As is apparent from the illustration according to FIG. 3, the frame opening 14 serves for the fixing accommodation of a plurality of test contacts which are arranged in parallel to one another and which, in the case at hand, are equidistantly spaced apart from one another. The test contacts 10 jointly with the test contact frame 13 form a test contact arrangement 15.

As shown in FIG. 1, in the exemplary embodiment at hand, the fastening base 12 with a fastening projection 16 thereof engages into the frame opening 14 in such a manner that a lower edge 17 of the fastening projection 16 is essentially aligned flush with a lower side 18 of the test contact frame 13 made of an electrically insulating material. In this process, positioning stops 19, 20 of the fastening base 12 abut against an upper side 21 of the test contact frame 13.

By means of positive interference between the fastening projection 16 and the frame opening 14 of the test contact frame 13 forming an interference fit between the fastening projection 16 and frame opening 14, illustrated in FIG. 1, a certain degree of fixation of the test contact 10 with respect to the test contact frame 13 is already obtained, so that in this position, a solid mechanical connection of the test contact 10 with the test contact frame 13 can be realized with the aid of solder material connections 22, 23.

Figure 2:
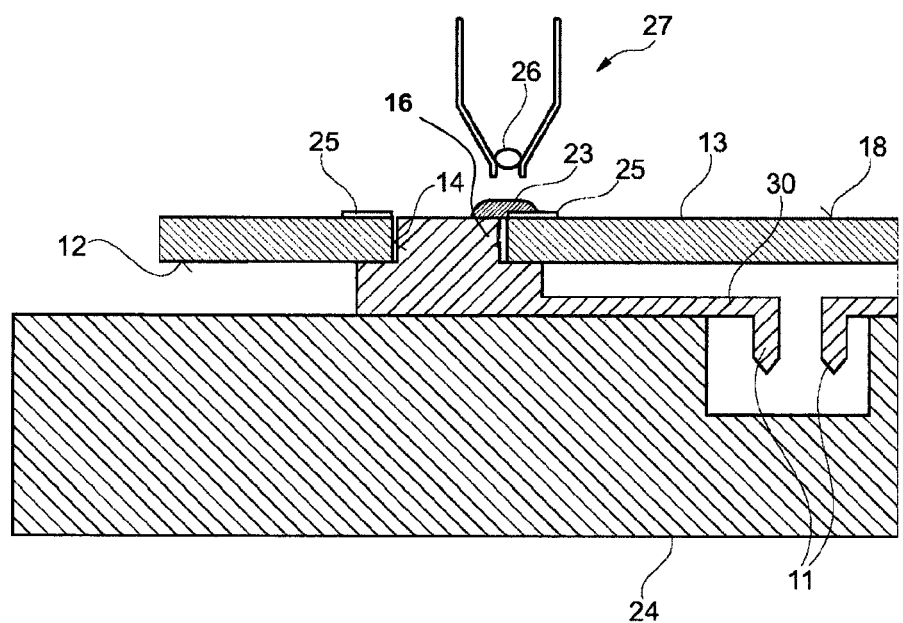
FIG. 2 shows a test contact frame equipped with test contacts during the production of the solder material connections.

For producing the solder material connections 22, 23 and, where appropriate, also for the previous fixing of the test contact 10 in the test contact frame 13, the test contacts 10 are arranged on a mounting platform 24, according to the illustration of FIG. 2, with the fastening base 12 thereof pointing upwardly. The mounting platform 24 on its upper side features a recess having the contact tips 11 engaged therein for enabling a planar abutment of the cantilever arm 30 on the mounting platform 24.

Figure 4:
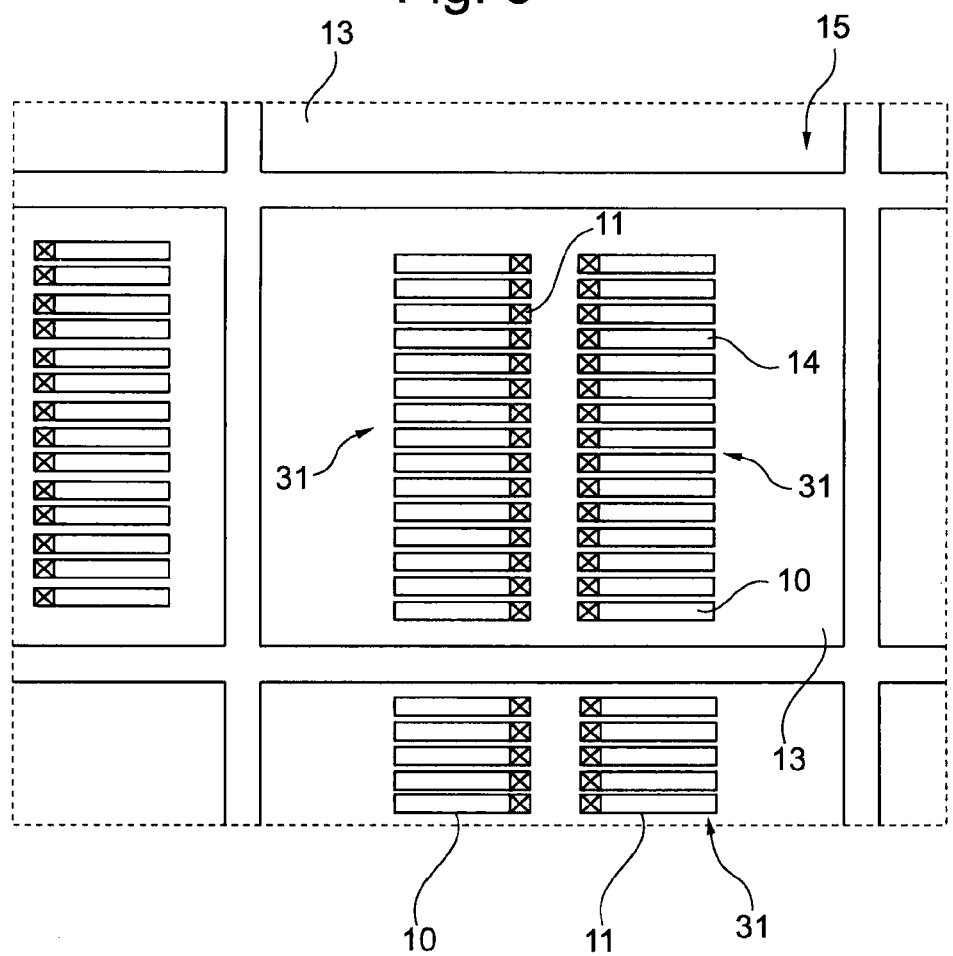
FIG. 4 shows a plan view of a test contact arrangement with a plurality of test contact row arrangements disposed in a matrix arrangement and each being assigned to a component to be tested.

In this position of the test contacts 10, which, as illustrated in FIG. 4, with their cantilever arms 30 facing one another are arranged in two parallel frame openings 14 of the test contact frame 13, the lower edge 17 of the test contacts 10, respectively the fastening projections 16, is connected to contact metallizations 25 arranged on the edges of the frame openings 14 by means of the application of a solder material deposit 26 for producing the solder material connections 22, 23. The contact metallizations 25 on the test contact frame 13 advantageously may be composed of a gold metallization.

As can also be seen from FIG. 2, the application of the solder material deposits 26 is performed on the lower edge 17, respectively the contact metallizations 25 of the test contact frame 13 in such a manner that a solder material deposit 26 is cast on a contact metallization 25 and the adjacent region of the lower edge 17 of the electrically conductive test contact 10, which is preferably formed of a metal, by means of a solder material ejection device 27. To this end, the solder material deposit 26 in the solder material ejection device 27 is at least partially liquefied, due to exposure to laser energy and is subsequently cast on the contact point while being exposed to compressed air.

As shown in FIG. 3, the contacting of the test contact arrangement 15 is performed with a test platform 28, which serves for electrical testing of semiconductor components, in such a manner that the terminal contacts formed by the solder material connections 22, 23 are connected to test terminals 29 of the test platform 28.

FIG. 4 shows the test contact arrangement 15 with a plurality of test contact row arrangements 31 in a matrix arrangement, wherein two parallel test contact row arrangements 31, which with their cantilever arms 30 are facing one another, serve for contacting with a component.

The test contact row arrangements 31 in particular are arranged on the test platform 28 in such a manner that two parallel test contact row arrangements 31 are each assigned to an electronic component arranged in a wafer assembly. Such electronic components for instance may be formed as memory chips, wherein each contact tip 11 of a test contact row arrangement 31 can be connected to a terminal contact of the memory chip.

With the aid of a testing device connected to the periphery of the test platform 28 and by means of a conductor arrangement realized in the test platform 28, the individual memory chips can then be tested in a targeted manner by placing the wafer on the plurality of test contact row arrangements 31.

The electrically conductive connection, illustrated in FIG. 3, between the solder material connections 22, 23 of the test contact arrangement 15 and the test terminals 29 of the test platform 28 may be performed in a reflow process

The invention claimed is:

1. A test contact arrangement for testing semiconductor components, said test contact comprising:
   at least one test contact arranged in a test contact frame, said at least one test contact including a contact arm having a contact tip and being cantilevered from a fastening base, the fastening base including a fastening projection received in a frame opening of the test contact frame in an interference fit, a lower edge of the fastening projection being aligned flush with a lower side of the test contact frame, said fastening projection fixing said at least one test contact relative to said test contact frame, the test contact frame and the test contact being connected to one another via a solder material connection formed on the lower side of the test contact frame, the solder material connection being formed in an electrically conductive manner between at least one contact surface arranged on the lower side of the test contact frame and the lower edge of the fastening projection of the test contact, wherein the at least one contact surface is formed of an electrically conductive contact material applied to the surface of the test contact frame which is formed of an electrically non-conductive material.

2. The test contact arrangement according to claim 1, in which the fastening base has at least one positioning stop at a distance from the lower edge, wherein the distance corresponds to the thickness of the test contact frame.

3. The test contact arrangement according to claim 1, wherein said interference fit is configured as a press-fit engagement.

4. The test contact arrangement according to claim 1, in which the contact surface is arranged at an opening edge of the frame opening.

5. The test contact arrangement according to claim 1, in which the frame opening arranged in the test contact frame has two parallel opening edges which extend in a plane direction of the test contact frame, a plurality of test contacts with their fastening projections being arranged in a test contact row arrangement between the opening edges in such a manner that the contact arms are aligned transverse to the plane direction.

6. The test contact arrangement according to claim 5, in which the test contact frame has a plurality of frame openings which are disposed in a matrix arrangement and are each provided with a test contact row arrangement.

7. The test contact arrangement according to claim 6, in which the matrix arrangement has a plurality of frame opening groups which are each assigned to a semiconductor component to be tested and comprise at least two frame openings which are disposed in parallel to one another and which are each provided with a test contact row arrangement in such a manner that the contact tips formed at the contact arms are arranged in a contact tip arrangement corresponding to a terminal face arrangement of the semiconductor components to be tested.

* * * * *